US008301419B1

(12) United States Patent
Suhr et al.

(10) Patent No.: US 8,301,419 B1
(45) Date of Patent: Oct. 30, 2012

(54) MANAGING INFORMATION FOR GENERATING MODELS OF PARTS

(75) Inventors: Timothy J. Suhr, Algona, WA (US); Patrick L. Walsh, Bothell, WA (US); Edward J. Levinskas, St. Charles, MO (US)

(73) Assignee: The Boeing Company, Chicago, IL (US)

( * ) Notice: Subject to any disclaimer, the term of this patent is extended or adjusted under 35 U.S.C. 154(b) by 406 days.

(21) Appl. No.: 12/577,149

(22) Filed: Oct. 9, 2009

(51) Int. Cl.
*G06F 17/50* (2006.01)

(52) U.S. Cl. .............................................. 703/1; 700/98

(58) Field of Classification Search ........................ 703/1
See application file for complete search history.

(56) References Cited

U.S. PATENT DOCUMENTS

| | | | | |
|---|---|---|---|---|
| 5,594,837 | A | * | 1/1997 | Noyes ............................ 706/55 |
| 5,701,403 | A | | 12/1997 | Watanabe et al. |
| 5,896,138 | A | | 4/1999 | Riley |
| 5,945,995 | A | | 8/1999 | Higuchi et al. |
| 6,295,513 | B1 | | 9/2001 | Thackston |
| 6,571,146 | B1 | * | 5/2003 | Dennehy ......................... 700/98 |
| 6,629,093 | B1 | | 9/2003 | Davis et al. |
| 6,867,771 | B2 | | 3/2005 | Kripac |
| 6,931,294 | B2 | * | 8/2005 | Macy et al. .................... 700/98 |
| 7,398,129 | B2 | * | 7/2008 | Ishii et al. .................... 700/104 |
| 7,495,662 | B2 | * | 2/2009 | Rameau et al. ............... 345/420 |
| 7,912,692 | B2 | * | 3/2011 | Matsushita et al. ............ 703/13 |
| 2003/0220911 | A1 | | 11/2003 | Tompras et al. |
| 2005/0071135 | A1 | | 3/2005 | Vredenburgh et al. |
| 2008/0312880 | A1 | * | 12/2008 | McLuckie ......................... 703/1 |
| 2009/0259440 | A1 | | 10/2009 | Reed et al. |

OTHER PUBLICATIONS

Canli, Hakan, A Visual Meta-Language for Generic Modeling, Thesis, Air Force Institute of Technology, Mar. 10, 2002.*
Mantyla, M., "A Modeling System for Top-Down Design of Assembled Products", IBM J. Res. Develop. vol. 34, No. 5, Sep. 1990.*
Saleh et al, "On the Way to Modeling: A Case Study in Managing Model Transformations in MDA", Proceedings of the 9th WSEAS International Conference on Distance Learning and Web Engineering, Sep. 3-5, 2009.*
Selveit, Ann Helga, "An Abstraction-Based Rule Approach to Large Scale Information Systems Development", CAiSE '93, 1993.*
Stoiber et al, "Visualization Support for Software Product Line Modeling", Proceedings of the 2nd International Workshop on Visualization in Software Product Line Engineering, 2008.*
Van Amerongen et al, "Modeling of Physical Systems for the Design and Control of Mechatronic Systems", Annual Reviews in Control, 27, pp. 87-117, 2003.*
USPTO Office action for the U.S. Appl. No. 12/262,629 dated Jan. 10, 2011.
USPTO Final Office Action dated May 10, 2011 for U.S. Appl. No. 12/262,629.

* cited by examiner

*Primary Examiner* — Mary C Jacob
(74) *Attorney, Agent, or Firm* — Yee & Associates, P.C.

(57) ABSTRACT

A method and apparatus are present for managing information for parts. Information for a part is identified. The information comprises a plurality of features for the part, a number of levels of details for each of the plurality of features, and a history associated with the plurality of features. The plurality of features for the part, the number of levels of detail for each of the plurality of features, and the history associated with the plurality of features are associated with each other to form a plurality of associations. The information and the plurality of associations are stored in a repository.

25 Claims, 11 Drawing Sheets

800

| | LEVEL OF DETAIL | MODELED? | PART NUMBER | POINT/ GEOMETRIC DEFINITION | EXTERNAL DEFINITION | INTERNAL DEFINITION | PART TEXTUAL INFORMATION | ASSEMBLY DEFINITION | SIMULATION DEFINITION |
|---|---|---|---|---|---|---|---|---|---|
| 806 | 0 | NO | NO | NO | NO | NO | NO | NO | NO |
| 808 | 1 | YES | YES | POINT | NO | NO | NO | NO | NO |
| 810 | 2 | YES | YES | GEOMETRIC | NO | NO | NO | NO | NO |
| 812 | 3 | YES | YES | GEOMETRIC | LIMITED | LIMITED | LIMITED | NO | NO |
| 814 | 4 | YES | YES | GEOMETRIC | LIMITED | LIMITED | LIMITED | LIMITED | NO |
| 816 | 5 | YES | YES | GEOMETRIC | LIMITED | LIMITED | LIMITED | LIMITED | LIMITED |
| 818 | 6 | YES | YES | GEOMETRIC | LIMITED | LIMITED | FULL | LIMITED | LIMITED |
| 820 | 7 | YES | YES | GEOMETRIC | FULL | LIMITED | FULL | LIMITED | LIMITED |
| 822 | 8 | YES | YES | GEOMETRIC | FULL | FULL | FULL | LIMITED | LIMITED |
| 824 | 9 | YES | YES | GEOMETRIC | FULL | FULL | FULL | FULL | LIMITED |
| 826 | 10 | YES | YES | GEOMETRIC | FULL | FULL | FULL | FULL | FULL |

802 / 801 803 805 807 809 811 813 815 817

| 801 | 803 | 805 | 807 | 809 | 811 | 813 | 815 | 817 |
|---|---|---|---|---|---|---|---|---|
| LEVEL OF DETAIL | MODELED? | PART NUMBER | POINT/ GEOMETRIC DEFINITION | EXTERNAL DEFINITION | INTERNAL DEFINITION | PART TEXTUAL INFORMATION | ASSEMBLY DEFINITION | SIMULATION DEFINITION |
| 0 | NO | NO | NO | NO | NO | NO | NO | NO |
| 1 | YES | YES | POINT | NO | NO | NO | NO | NO |
| 2 | YES | YES | GEOMETRIC | LIMITED | NO | NO | NO | NO |
| 3 | YES | YES | GEOMETRIC | LIMITED | LIMITED | LIMITED | NO | NO |
| 4 | YES | YES | GEOMETRIC | LIMITED | LIMITED | LIMITED | LIMITED | NO |
| 5 | YES | YES | GEOMETRIC | LIMITED | LIMITED | FULL | LIMITED | LIMITED |
| 6 | YES | YES | GEOMETRIC | FULL | FULL | FULL | LIMITED | LIMITED |
| 7 | YES | YES | GEOMETRIC | FULL | FULL | FULL | LIMITED | LIMITED |
| 8 | YES | YES | GEOMETRIC | FULL | FULL | FULL | LIMITED | LIMITED |
| 9 | YES | YES | GEOMETRIC | FULL | FULL | FULL | FULL | LIMITED |
| 10 | YES | YES | GEOMETRIC | FULL | FULL | FULL | FULL | FULL |

*FIG. 8*

| 902 PRIMARY FEATURES | 904 SECONDARY FEATURES | 906 TERTIARY FEATURES | 908 LEVEL OF DETAIL | 910 HISTORY |
|---|---|---|---|---|
| BOLT HEAD | | | 3 | |
| | 914 HEAD TYPE | | 3 | REQUIRED FOR 3D MBD MODELING |
| | | 922 RECESSED | 0 | |
| | | 924 CHAMFERED | 0 | |
| | 916 HEAD THICKNESS | | 3 | REQUIRED FOR 3D MBD MODELING |
| | 918 CAPTIVE WASHER | | 3 | REQUIRED FOR FIT CHECK AND PROPER SHAFT LENGTH POSITIONING – FOR BUSINESS UNIT |
| | | 926 THICKNESS | 3 | REQUIRED FOR FIT CHECK AND PROPER SHAFT LENGTH POSITIONING – FOR BUSINESS UNIT |
| | | 928 DIAMETER | 3 | REQUIRED FOR FIT CHECK AND PROPER SHAFT LENGTH POSITIONING – FOR BUSINESS UNIT |
| | 920 LOCK WIRE HOLES | | 0 | |
| | | 930 DIAMETER | 0 | |
| | | 932 LOCATION | 0 | |

FIG. 9

MANAGING INFORMATION FOR GENERATING MODELS OF PARTS

BACKGROUND INFORMATION

1. Field

The present disclosure relates generally to models of parts and, in particular, to managing information for models of parts. Still more particularly, the present disclosure relates to a method and apparatus to manage an amount of detail in models of parts.

2. Background

Models of parts are typically used to design vehicles, parts, objects, and/or other suitable platforms or components. Models of parts comprise information for the parts. For example, a part may have a plurality of features for the part. A model of the part may be generated based on a portion or all of the plurality of features for the part. Further, models of parts may be used in performing operations such as, for example, without limitation, designing a configuration of a part, testing a configuration of a part, performing simulations involving a part, determining whether a part is a suitable replacement for another part, and/or other suitable operations.

Currently, models of parts may be generated using programs run on computers for generating models. Software such as, for example, without limitation, computer-aided design (CAD) programs and other suitable software may be used to generate models of parts. Computer-aided design programs allow features such as, for example, without limitation, dimensions, geometrical features, materials, tolerances, processes, and/or other suitable features to be modeled. When generated using a software system, a model of a part may take the form of a data file.

Within companies using multiple computer-aided design (CAD) programs, there are standard part files in each of the computer-aided design programs for standard parts. Each computer-aided design program has a different way of modeling geometric properties and other features of a standard part, including differences driven by computer-aided design program constraints.

These aspects create a unique condition in which standard part modelers and designers agree upon which features should be modeled for different computer-aided design programs on a case-by-case basis. The standard part modelers may be the creators of the models, and the designers may be the users of the models. This increases the cost and prevents migration of existing information to any given computer-aided design program as it prevents similar technological features between computer-aided design programs from being mapped and managed.

Therefore, it would be advantageous to have a method and apparatus that takes into account at least some of the issues discussed above, and possibly other issues.

SUMMARY

In one advantageous embodiment, an apparatus comprises information for a plurality of parts in which the information is stored in a repository and a computer system. The information comprises a plurality of features for each of the plurality of parts, a number of levels of detail, and a history associated with the plurality of features for each of the plurality of parts. Each feature in the plurality of features has a number of levels of detail. The computer system is configured to identify a desired level of detail for a model of a part. The computer system is also configured to select a number of features from the plurality of features based on the desired level of detail for the model of the part in which each of the number of features selected has a level of detail in the number of levels of details based on the desired level of detail for the model of the part. Further, the computer system is configured to generate the model of the part with the desired level of detail using information for the part, the desired level of detail for the model of the part, and the number of features selected from the plurality of features.

In another advantageous embodiment, a design environment comprises a repository, information for a plurality of parts stored in the repository, a computer program stored on a storage device, and a computer system connected to the repository and configured to run the computer program. The information comprises a plurality of features for each of the plurality of parts, a number of levels of detail, and a history associated with the plurality of features for the each of the plurality of parts. Each feature in the plurality of features has the number of levels of detail. The computer system is configured to run the computer program to identify a desired level of detail for a model of a part. The computer system is configured to run the computer program to select a number of features from the plurality of features based on the desired level of detail for the model of the part in which each of the number of features selected has a level of detail in the number of levels of detail based on the desired level of detail for the model of the part. The computer system is configured to run the computer program to generate the model of the part with the desired level of detail using the information for the part, the desired level of detail for the model of the part, and the number of features selected from the plurality of features.

In another advantageous embodiment, a method is present for managing information for parts. Information for a part is identified. The information comprises a plurality of features for the part, a number of levels of details for each of the plurality of features, and a history associated with the plurality of features for the part. The plurality of features for the part, the number of levels of details for each of the plurality of features, and the history associated with the plurality of features are associated with each other to form a plurality of associations. The information and the plurality of associations are stored in a repository.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

FIG. 8 is an illustration of a table of levels of detail in accordance with an advantageous embodiment;

FIG. 9 is an illustration of information provided by a particular level of detail for a bolt head in accordance with an advantageous embodiment;

DETAILED DESCRIPTION

Figure 1:
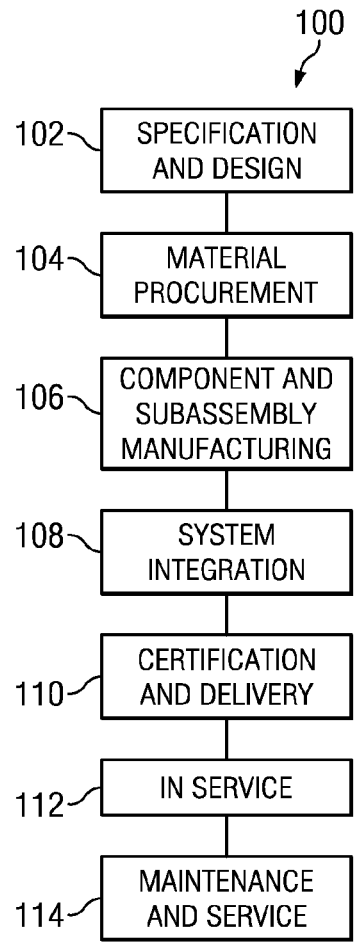
FIG. 1 is an illustration of an aircraft manufacturing and service method in accordance with an advantageous embodiment.
Figure 2:
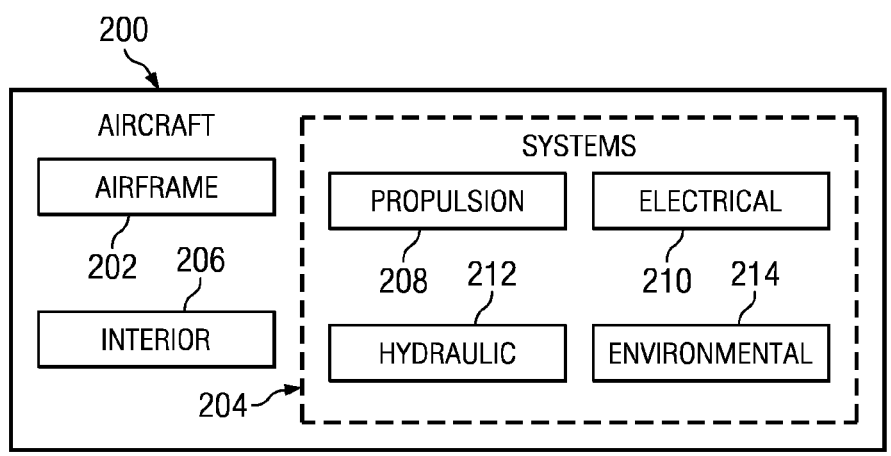
FIG. 2 is an illustration of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 may take place. Thereafter, aircraft 200 in FIG. 2 may go through certification and delivery 110 in order to be placed in service 112. While in service 112 by a customer, aircraft 200 in FIG. 2 may be scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, an illustration of an aircraft is depicted in which an advantageous embodiment may be implemented. In this example, aircraft 200 may be produced by aircraft manufacturing and service method 100 in FIG. 1 and may include airframe 202 with a plurality of systems 204 and interior 206. Examples of systems 204 may include one or more of propulsion system 208, electrical system 210, hydraulic system 212, and environmental system 214. Any number of other systems may be included. Although an aerospace example is shown, different advantageous embodiments may be applied to other industries, such as the automotive industry. Additionally, different advantageous embodiments may be applied to other infrastructure industries, such as bridges and buildings.

Apparatus and methods embodied herein may be employed during any one or more of the stages of aircraft manufacturing and service method 100 in FIG. 1. For example, components or subassemblies produced in component and subassembly manufacturing 106 in FIG. 1 may be inspected while aircraft 200 is in maintenance and service 114 in FIG. 1.

Also, one or more apparatus embodiments, method embodiments, or a combination thereof may be utilized during service stages, such as maintenance and service 114 and in service 112 in FIG. 1, for example, without limitation, by substantially expediting the inspection and/or maintenance of aircraft 200.

Figure 3:
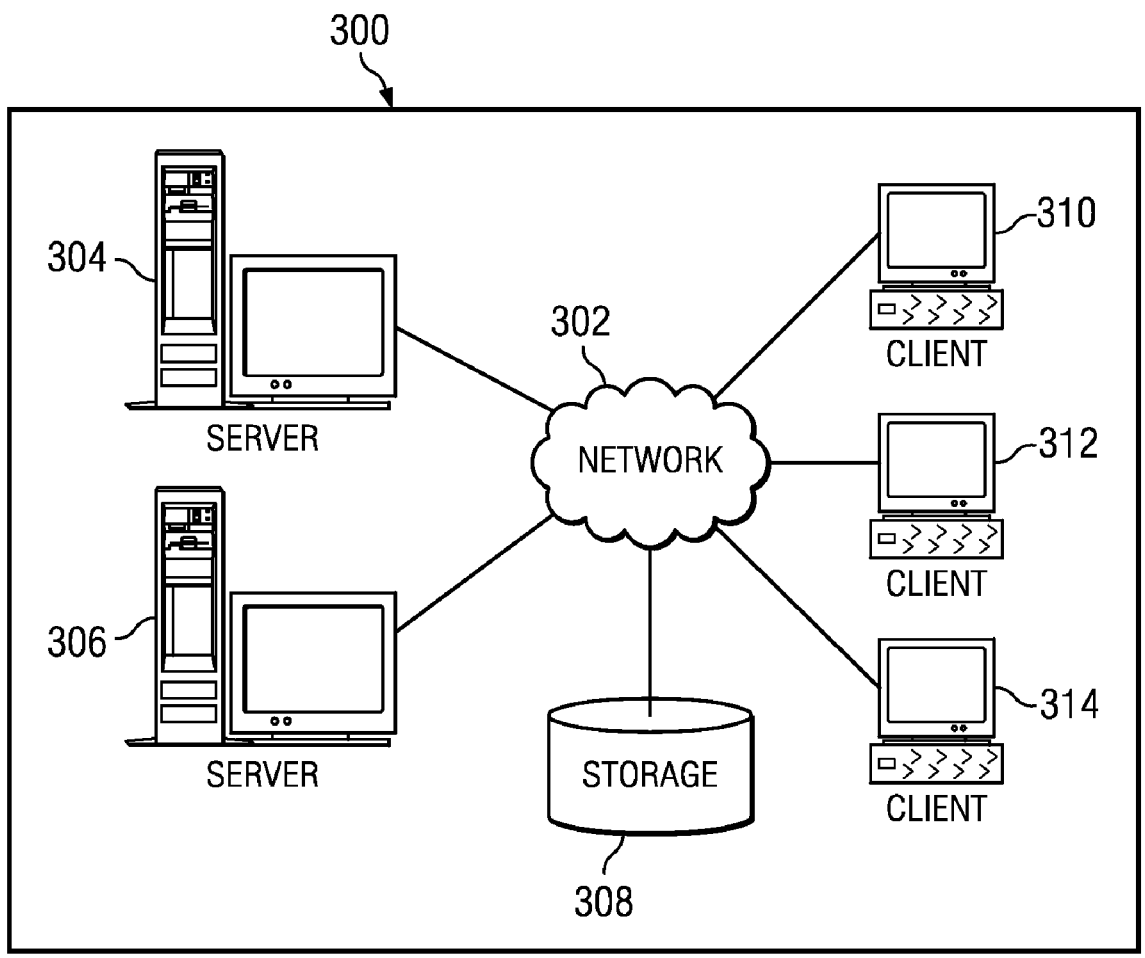
FIG. 3 is an illustration of a network of data processing systems in which illustrative embodiments may be implemented.
Figure 4:
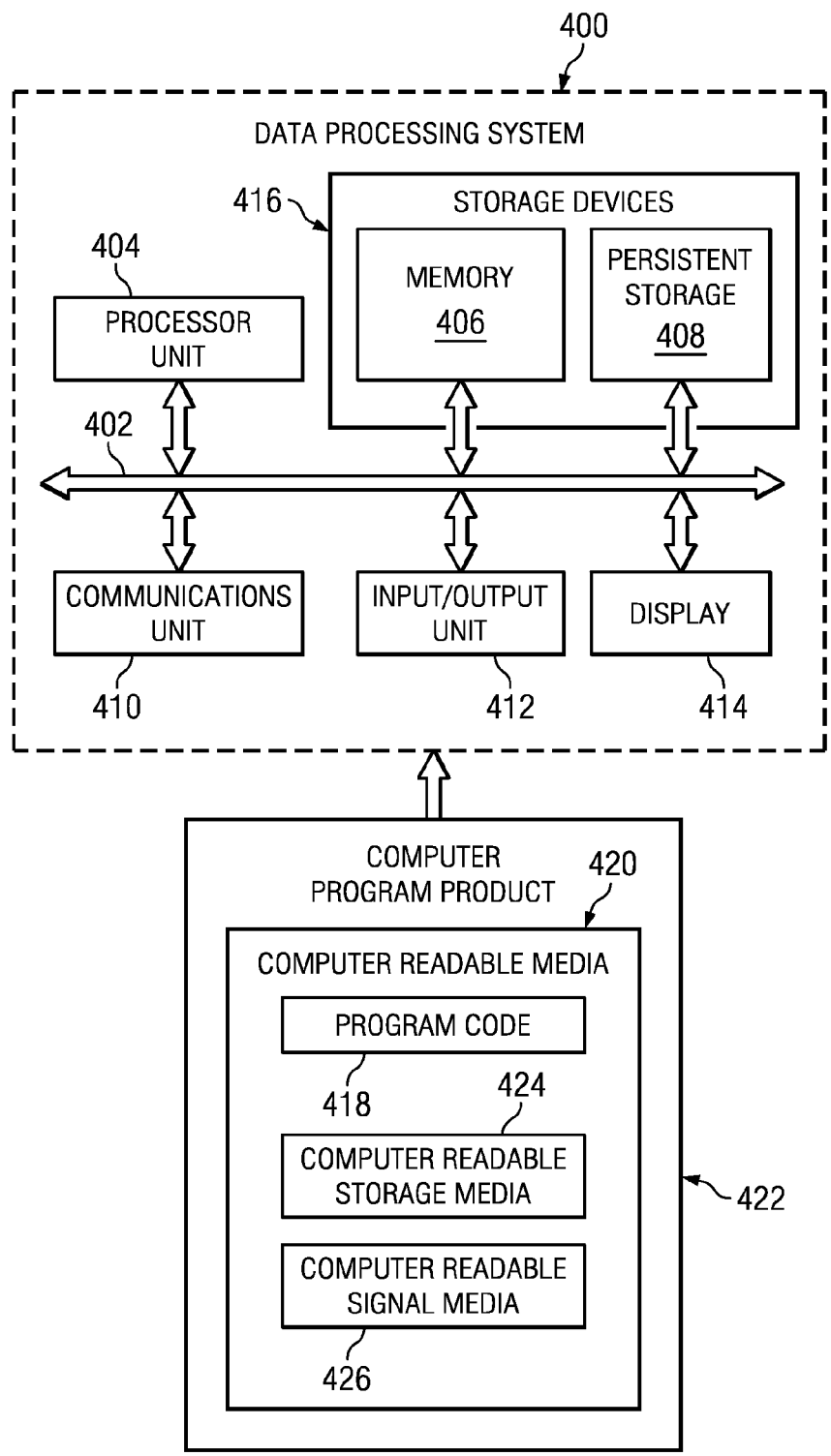
FIG. 4 is an illustration of a data processing system in accordance with an advantageous embodiment.

With reference now to FIGS. 3-4, exemplary illustrations of data processing environments are provided in which advantageous embodiments may be implemented. It should be appreciated that FIGS. 3-4 are only exemplary and are not intended to assert or imply any limitation with regard to the environments in which different embodiments may be implemented. Many modifications to the depicted environments may be made.

FIG. 3 depicts an illustration of a network of data processing systems in which advantageous embodiments may be implemented. Network data processing system 300 is a network of computers in which the advantageous embodiments may be implemented. In these illustrative examples, network data processing system 300 is used during specification and design 102 of aircraft 200 in FIGS. 1-2, respectively.

For example, network data processing system 300 may be used to generate, view, and/or alter models of parts for aircraft 200 for the design of aircraft 200. These parts may be new parts or replacement parts, which may be used during component and subassembly manufacturing 106, system integration 108, maintenance and service 114, and/or other suitable operations for aircraft 200 in FIG. 2.

Network data processing system 300 contains network 302, which is the medium used to provide communications links between various devices and computers connected together within network data processing system 300. Network 302 may include connections, such as wire, wireless communication links, or fiber optic cables.

In the depicted example, server 304 and server 306 connect to network 302 along with storage unit 308. In addition, clients 310, 312, and 314 connect to network 302. Clients 310, 312, and 314 may be, for example, personal computers or network computers. In the depicted example, server 304 provides information, such as boot files, operating system images, and applications to clients 310, 312, and 314. Clients 310, 312, and 314 are clients to server 304 in this example. Network data processing system 300 may include additional servers, clients, and other devices not shown.

In these illustrative examples, server 304 and/or server 306 provide information for parts that may be used during specification and design 102, component and subassembly manufacturing 106, maintenance and service 114, and/or other suitable operations for aircraft 200 in FIGS. 1-2. This information may be information for generating models of these parts. Further, server 304 and/or server 306 provide applications, such as computer-aided design programs, to clients 310, 312, and 314 on network 302 for generating these models.

Program code located in network data processing system 300 may be stored on a computer recordable storage medium and downloaded to a data processing system or other device for use. For example, program code may be stored on a computer recordable storage medium on server 304 and downloaded to client 310 over network 302 for use on client 310.

In the depicted example, network data processing system 300 is the Internet with network 302 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, governmental, educational, and other computer systems that route data and messages. Of course, network data processing system 300 also may be implemented as a number of different types of networks, such as, for example, an intranet, a local area network (LAN), or a wide area network (WAN). FIG. 3 is intended as an example and not as an architectural limitation for the different illustrative embodiments.

With reference now to FIG. 4, an illustration of a data processing system is depicted in accordance with an advantageous embodiment. Data processing system 400 is an example of a computer, such as server 304 or client 310 in FIG. 3, in which computer usable program code or instructions implementing the processes may be located for the illustrative embodiments. In this illustrative example, data processing system 400 includes communications fabric 402, which provides communications between processor unit 404, memory 406, persistent storage 408, communications unit 410, input/output (I/O) unit 412, and display 414.

Processor unit 404 serves to execute instructions for software that may be loaded into memory 406. Processor unit 404 may be a set of one or more processors or may be a multi-processor core, depending on the particular implementation. Further, processor unit 404 may be implemented using one or more heterogeneous processor systems, in which a main processor is present with secondary processors on a single chip. As another illustrative example, processor unit 404 may be a symmetric multi-processor system containing multiple processors of the same type.

Memory 406 and persistent storage 408 are examples of storage devices 416. A storage device is any piece of hardware that is capable of storing information, such as, for example, without limitation, data, program code in functional form, and/or other suitable information either on a temporary basis and/or a permanent basis. Memory 406, in these examples, may be, for example, a random access memory or any other suitable volatile or non-volatile storage device. Persistent storage 408 may take various forms, depending on the particular implementation. For example, persistent storage 408 may contain one or more components or devices. For example, persistent storage 408 may be a hard drive, a flash memory, a rewritable optical disk, a rewritable magnetic tape, or some combination of the above. The media used by persistent storage 408 may be removable. For example, a removable hard drive may be used for persistent storage 408.

Communications unit 410, in these examples, provides for communication with other data processing systems or devices. In these examples, communications unit 410 is a network interface card. Communications unit 410 may provide communications through the use of either or both physical and wireless communications links.

Input/output unit 412 allows for the input and output of data with other devices that may be connected to data processing system 400. For example, input/output unit 412 may provide a connection for user input through a keyboard, a mouse, and/or some other suitable input device. Further, input/output unit 412 may send output to a printer. Display 414 provides a mechanism to display information to a user.

Instructions for the operating system, applications, and/or programs may be located in storage devices 416, which are in communication with processor unit 404 through communications fabric 402. In these illustrative examples, the instructions are in a functional form on persistent storage 408. These instructions may be loaded into memory 406 for execution by processor unit 404. The processes of the different embodiments may be performed by processor unit 404 using computer implemented instructions, which may be located in a memory, such as memory 406.

These instructions are referred to as program code, computer usable program code, or computer readable program code that may be read and executed by a processor in processor unit 404. The program code, in the different embodiments, may be embodied on different physical or computer readable storage media, such as memory 406 or persistent storage 408.

Program code 418 is located in a functional form on computer readable media 420 that is selectively removable and may be loaded onto or transferred to data processing system 400 for execution by processor unit 404. Program code 418 and computer readable media 420 form computer program product 422. In one example, computer readable media 420 may be computer readable storage media 424 or computer readable signal media 426. Computer readable storage media 424 may include, for example, an optical or magnetic disk that is inserted or placed into a drive or other device that is part of persistent storage 408 for transfer onto a storage device, such as a hard drive, that is part of persistent storage 408. Computer readable storage media 424 also may take the form of a persistent storage, such as a hard drive, a thumb drive, or a flash memory, that is connected to data processing system 400. In some instances, computer readable storage media 424 may not be removable from data processing system 400.

Alternatively, program code 418 may be transferred to data processing system 400 using computer readable signal media 426. Computer readable signal media 426 may be, for example, a propagated data signal containing program code 418. For example, computer readable signal media 426 may be an electro-magnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples. The computer readable media also may take the form of non-tangible media, such as communications links or wireless transmissions containing the program code.

In some illustrative embodiments, program code 418 may be downloaded over a network to persistent storage 408 from another device or data processing system through computer readable signal media 426 for use within data processing system 400. For instance, program code stored in a computer readable storage media in a server data processing system may be downloaded over a network from the server to data processing system 400. The data processing system providing program code 418 may be a server computer, a client computer, or some other device capable of storing and transmitting program code 418.

The different components illustrated for data processing system 400 are not meant to provide architectural limitations to the manner in which different embodiments may be implemented. The different illustrative embodiments may be implemented in a data processing system including components in addition to or in place of those illustrated for data processing system 400. Other components shown in FIG. 4 can be varied from the illustrative examples shown. The different embodiments may be implemented using any hardware device or system capable of executing program code. As one example, data processing system 400 may include organic components integrated with inorganic components and/or may be comprised entirely of organic components excluding a human being. For example, a storage device may be comprised of an organic semiconductor.

As another example, a storage device in data processing system 400 is any hardware apparatus that may store data. Memory 406, persistent storage 408, and computer readable media 420 are examples of storage devices in a tangible form.

In another example, a bus system may be used to implement communications fabric 402 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 406 or a cache such as found in an interface and memory controller hub that may be present in communications fabric 402.

The different advantageous embodiments recognize and take into account a number of different considerations. For example, the different advantageous embodiments recognize and take into account that with currently available software for generating models of parts, different types of software may generate models with different features for a particular part in different ways. This software may take the form of computer-aided design programs, for example. In one illustrative example, a particular nut may have a hexagonal shape and a particular thread pattern. One computer-aided design program may be used to generate a model of the nut with both the hexagonal shape and the particular thread pattern. However, another program may not support the data for the thread pattern. This computer-aided design program may include the hexagonal shape of the nut without including the thread pattern of the nut in the model.

The different advantageous embodiments also recognize and take into account that the different types of currently available software for generating models may have different constraints. For example, some programs may generate models of parts in two dimensions, while other programs may generate models of parts in both two and three dimensions. As another example, different types of software for generating models may use different data file formats.

Further, the different advantageous embodiments recognize and take into account that the different types of currently available software for generating models of a part may not generate models with the same level of detail for the features of a part or the part itself. In other words, different types of software may generate models that provide different amounts of information for the same part.

The different advantageous embodiments also recognize that currently available software systems for generating models may not be configured to take into account a history associated with features of a part when generating models of the part. This history may include, for example, without limitation, a purpose for including a particular feature of a part in a model, a business condition for a feature, a manufacturing condition for a feature, rules for making changes to parts and/or features of a part, dates, and/or other suitable details about the features of a part.

The different advantageous embodiments recognize and take into account that currently, decisions regarding the generation of models of parts using different types of software are made on a case-by-case basis. For example, engineers and designers may determine which features of a part to model and how to model these features based on the software used for generating the model and/or a desired use of the model. In other words, decisions regarding a model of a part with respect to one currently available program may not apply to other currently available programs.

Further, the different advantageous embodiments recognize and take into account that engineers and designers make decisions regarding the generation of models of parts based on the different needs of an enterprise. For example, an organization, such as a company, a partnership, a consortium, or a business venture, may be comprised of different entities. These entities may support different products produced by the enterprise. For example, one entity in an organization may support one product produced by an enterprise, while a different entity in the organization may support a different product.

In other examples, one entity in an organization may support a number of products. Each entity may have different constraints regarding the generation of models of parts that may be used in the design and/or manufacturing of a product. In some examples, these constraints are based on the particular computer-aided design program used by each entity to generate the models of the parts. Thus, decisions regarding a model of a part with respect to one entity may not apply to another entity.

The different advantageous embodiments also recognize and take into account that these differences between different types of software may prevent similar properties between software from being managed. Further, these differences may increase the time and cost of transferring information between different types of software.

Further, the different advantageous embodiments recognize and take into account that currently available software for generating models are not configured to account for differences in the terminology and/or details for features of a part. These differences in terminology and/or details may be due to the engineers and/or designers defining the terminology and/or details for these features based on different software systems, different parts standards, different business rules, and/or other reasons.

Thus, the different advantageous embodiments provide a method and apparatus for managing part information. In one advantageous embodiment, an apparatus comprises information for a plurality of parts in which the information is stored in a repository and a computer system. The information comprises a plurality of features for each of the plurality of parts, a number of levels of detail, and a history associated with each of the plurality of parts. Each feature in the plurality of features has a number of levels of detail.

The computer system is configured to identify a desired level of detail for a model of a part. The computer system is also configured to select a number of features from the plurality of features based on the desired level of detail for the model of the part in which each of the number of features selected has a level of detail in the number of levels of details based on the desired level of detail for the model of the part. Further, the computer system is configured to generate the model of the part with the desired level of detail using information for the part, the desired level of detail for the model of the part, and the number of features selected from the plurality of features.

Figure 5:
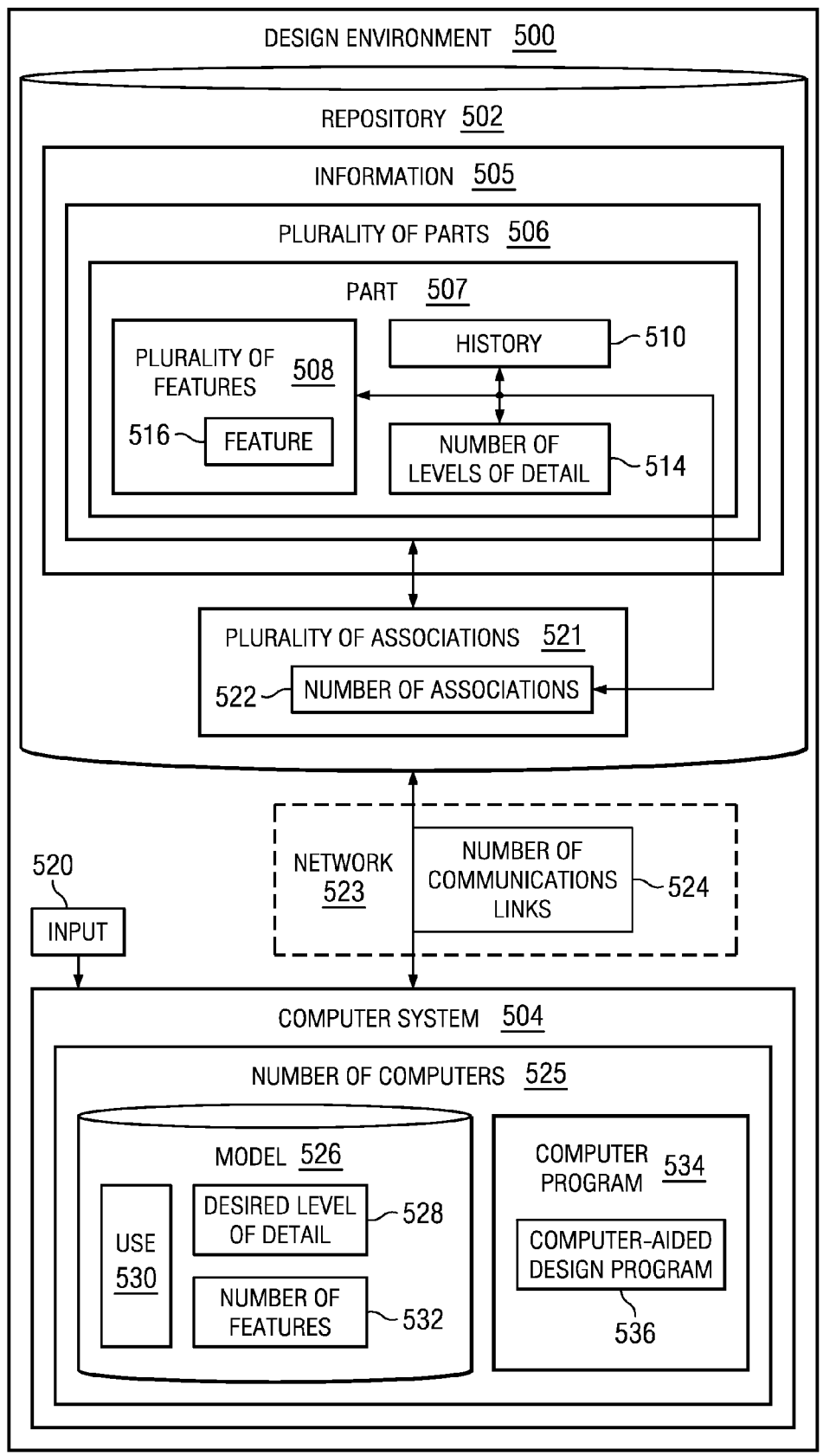
FIG. 5 is an illustration of a design environment in accordance with an advantageous embodiment.

With reference now to FIG. 5, an illustration of a design environment is depicted in accordance with an advantageous embodiment. In this illustrative example, design environment 500 may be implemented using, for example, network data processing system 300 in FIG. 3. In these illustrative examples, design environment 500 may be used during specification and design 102 of aircraft 200 in FIGS. 1-2.

For example, design environment 500 may be used to generate, view, and/or alter models of parts for aircraft 200 in FIG. 2 for the design of aircraft 200. These parts may be new parts or replacement parts, which may be used during component and subassembly manufacturing 106, system integration 108, maintenance and service 114, and/or other suitable operations for aircraft 200.

In other advantageous embodiments, design environment 500 may be used to generate, view, and/or alter models of parts for platforms other than aircraft 200. These platforms may be, for example, without limitation, a mobile platform, a stationary platform, a land-based structure, an aquatic-based structure, a space-based structure, a submarine, a bus, a personnel carrier, a tank, a train, an automobile, a spacecraft, a space station, a satellite, a surface ship, and/or some other suitable platform.

As depicted, design environment 500 includes repository 502 and computer system 504. In these illustrative examples, repository 502 is a storage system for storing data. Repository 502 may be in one location or may be distributed among many locations. For example, repository 502 may be implemented in storage unit 308 in FIG. 3. In some advantageous embodiments, repository 502 may be a storage system distributed among two servers, such as server 304 and server 306 in FIG. 3. In other advantageous embodiments, repository 502 may be a storage device, such as a storage device within storage devices 416 in data processing system 400 in FIG. 4.

Repository 502 stores information 505 for plurality of parts 506. Plurality of parts 506 may include parts such as, for example, without limitation, nuts, bolts, rivets, adapters, fasteners, valves, latch assemblies, hinges, clamps, and/or other suitable types of parts. These parts may be used for the manufacture and/or repair of objects for platforms.

Information 505 may be stored in a data structure such as, for example, a number of tables, a database, an extensible markup language (XML) data structure, a data file, or some other suitable type of data structure. In these illustrative examples, the data structure may be configured such that information 505 may be used with different types of software, file formats, and computer programs.

Information 505 for plurality of parts 506 comprises information for generating model 526 of each part within plurality of parts 506. For example, information 505 for part 507 in plurality of parts 506 comprises plurality of features 508, number of levels of detail 514, and history 510 associated with plurality of features 508.

In this illustrative example, a feature in plurality of features 508 may be a feature such as, for example, a name of a part or feature of a part, a definition of a physical component of the part, information about construction of the physical component, information about a use of the physical component, information about a relation of the physical component to another physical component, and/or other some other suitable feature. In some advantageous embodiments, plurality of features 508 may include geometric features, materials, dimensions, physical properties, chemical properties, electrical properties, and/or other suitable features.

Each feature in plurality of features 508 may have number of levels of detail 514. Each level of detail in number of levels of detail 514 provides a different amount of information for plurality of features 508. For example, feature 516 may have number of levels of detail 514. Different levels of detail in number of levels of detail 514 provide different amounts of information for feature 516. Number of levels of detail 514 is also for part 507.

In these illustrative examples, history 510 is associated with plurality of features 508. For example, history 510 includes a purpose for including a particular feature of a part in model 526, a business condition for a feature, a manufacturing condition for a feature, rules for making changes to features of parts, dates for when information has been added to history 510, and/or other suitable information about the features of a part. Further, history 510 may also include a number of conditions for having a feature in model 526 with number of levels of detail 514. In some advantageous embodiments, history 510 may be included as textual information within model 526 of part 507.

In this illustrative example, repository 502 also stores plurality of associations 521 for plurality of parts 506. Plurality of associations 521 may be stored as a data structure, such as a number of tables, a database, an extensible markup language (XML) data structure, a data file, or some other suitable type of data structure.

Plurality of associations 521 provides relationships for information 505 for plurality of parts 506. For example, number of associations 522 provides relationships between information 505 for part 507. In other words, each association in number of associations 522 associates plurality of features 508, number of levels of detail 514, and history 510 to each other. As one illustrative example, one association may associate feature 516 with a particular level of detail in number of levels of detail 514 based on a condition in history 510. This association is used to determine the manner in which model 526 for part 507 is generated in the depicted examples.

Computer system 504 includes number of computers 525. Each of number of computers 525 may be implemented using, for example, data processing system 400 in FIG. 4. As depicted in this example, computer system 504 is connected to repository 502. Computer system 504 is connected to repository 502 over network 523. Network 523 is an example of one implementation for network 302 in FIG. 3.

In these advantageous embodiments, computer system 504 is connected to repository 502 over network 523 using number of communications links 524. Number of communications links 524 may be a number of wireless communications links and/or a number of wired communications links that form network 523. In this manner, computer system 504 is configured to access, retrieve, change, update, and/or store data within repository 502.

In this illustrative example, number of computers 525 uses information 505 and number of associations 522 in repository 502 to form model 526 of part 507. In particular, computer system 504 identifies desired level of detail 528 for model 526. Desired level of detail 528 is identified based on use 530 for model 526 of part 507.

Use 530 may comprise, for example, without limitation, a number of business uses, a number of safety requirements, a number of client requests, a number of rules, a computer program for model 526, a file format for model 526, and/or some other suitable type of use.

In these examples, a business use may be a use for model 526 by a company. The number of business uses may be selected from at least one of a presentation to a customer, manufacturing of a part, design of the part, a simulation using the part, testing the part, disassembly of the part, repair of the part, and/or other suitable business uses. As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B, or item B. This example also may include item A, item B, and item C, item B and item C, or item C.

As one example, use 530 for model 526 of part 507 may be using model 526 for a simulation of the assembly of an object using part 507. As another example, use 530 for model 526 may be for a visual presentation of part 507 to a customer. As yet another example, a business use for model 526 may be to generate a three-dimensional model using a particular computer program.

Computer system 504 identifies use 530 for model 526 based on input 520 received at computer system 504. Input 520 may be received from an operator at computer system 504, another computer system, or some other suitable source. In this illustrative example, input 520 includes use 530. For example, input 520 may be a request for model 526 for a particular business use, an identification of desired level of detail 528, an identification of a desired file format for model 526, or some other type of input.

In this illustrative example, computer system 504 also selects number of features 532 from plurality of features 508 based on desired level of detail 528 to form model 526 with desired level of detail 528. Further, computer system 504 identifies a level of detail in number of levels of detail 514 for each feature in number of features 532.

In this depicted example, computer system 504 identifies desired level of detail 528 and selects number of features 532 using plurality of associations 521 of information 505 in repository 502. In other words, computer system 504 uses plurality of associations 521 to match use 530 to plurality of features 508, number of levels of detail 514, and history 510 such that desired level of detail 528 may be identified and number of features 532 may be selected. In this illustrative example, history 510 may be related to plurality of features 508 and number of levels of detail 514 such that a model of a feature or a part does not have a greater amount of information than is needed based on history 510 and use 530.

Computer system 504 forms model 526 of part 507 with desired level of detail 528 in this illustrative example. Model 526 is formed using computer program 534 run on computer system 504. Computer program 534 may be computer-aided design program 536 in this illustrative example.

The illustration of design environment 500 in FIG. 5 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, design environment 500 may include another computer system in addition to computer system 504. The additional computer system may be configured to form model 526 of part 507. This additional computer system may also be connected to repository 502 over network 523. In other advantageous embodiments, the additional computer system may be connected to repository 502 using a network other than network 523.

Figure 6:
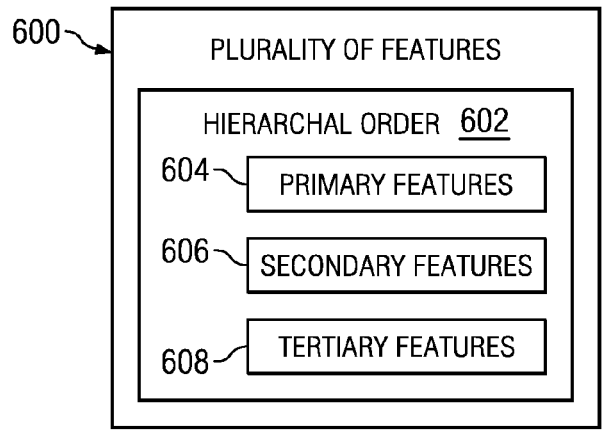
FIG. 6 is an illustration of a plurality of features for a part in accordance with an advantageous embodiment.

With reference now to FIG. 6, an illustration of a plurality of features for a part is depicted in accordance with an advantageous embodiment. In this illustrative example, plurality of features 600 is an example of one implementation for plurality of features 508 within information 505 for part 507 in FIG. 5.

As depicted in this example, plurality of features 600 is organized into hierarchal order 602. In this illustrative example, hierarchal order 602 includes three hierarchal classes for plurality of features 600. Each of these classes is a set of features within plurality of features 600. The classes, in these illustrative examples, are primary features 604, secondary features 606, and tertiary features 608.

In these examples, primary features 604 are features that define and/or provide information for basic components of a part. Secondary features 606 are features that define and/or provide information for primary features 604. Tertiary features 608 are features that define and/or provide information for secondary features 606.

In some advantageous embodiments, hierarchal order 602 may include some other number of classes for plurality of features 600. In other advantageous embodiments, plurality of features 600 may be organized in some other suitable manner.

Figure 7:
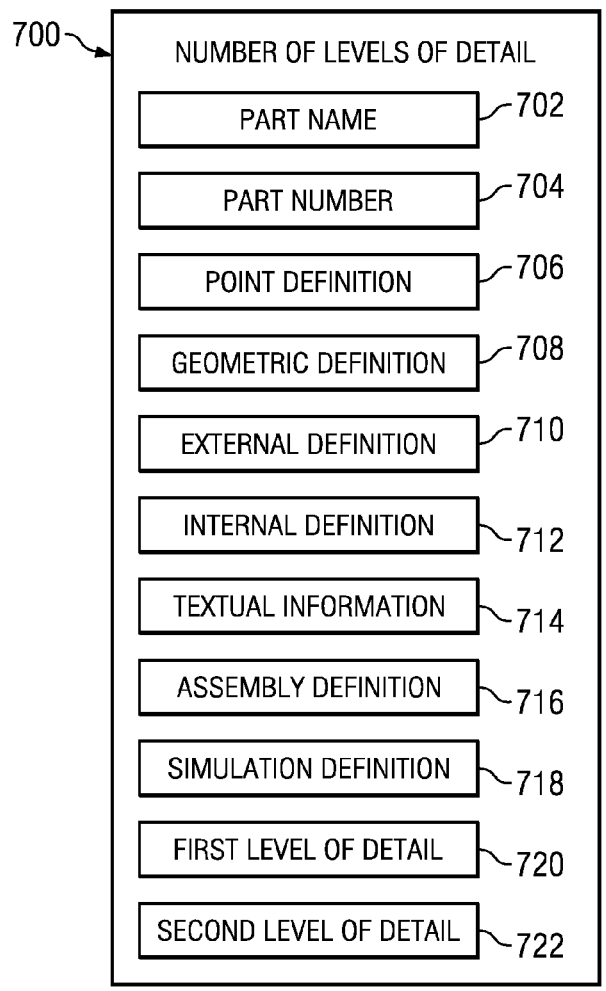
FIG. 7 is an illustration of a number of levels of detail in accordance with an advantageous embodiment.

With reference now to FIG. 7, an illustration of a number of levels of detail is depicted in accordance with an advantageous embodiment. In this illustrative example, number of levels of detail 700 is an example of one implementation for number of levels of detail 514 in FIG. 5.

Each level of detail in number of levels of detail 700 indicates that a certain amount of information may be provided in a model of a part. Number of levels of detail 700 may be for features of a part, such as plurality of features 600 in FIG. 6, or for the part itself. The types of information presented in the different levels of detail include, for example, without limitation, part name 702, part number 704, point definition 706, geometric definition 708, external definition 710, internal definition 712, textual information 714, assembly definition 716, simulation definition 718, and/or other suitable information.

In these illustrative examples, different levels in number of levels of detail 700 provide different amounts of information as compared to other levels of detail. For example, first level of detail 720 provides a limited external definition 710, a limited internal definition 712, and limited textual information 714. Second level of detail 722 provides a complete external definition 710, a complete internal definition 712, and complete textual information 714.

In this illustrative example, second level of detail 722 is a higher level of detail than first level of detail 720. In other words, second level of detail 722 provides a greater amount of information for a feature and/or a part as compared to first level of detail 720.

For example, when the part is a nut, first level of detail 720 for the nut includes an external shape of the nut, an internal shape of the nut, a thickness of the nut, a diameter of the nut, and text describing materials for the nut. Second level of detail 722 for the nut includes all of the information provided by first level of detail 720, as well as a thread pattern for the nut, information indicating whether the nut has a recessed or chamfered surface, text describing different thread patterns, and text describing bolts that may be used with the nut.

With reference now to FIG. 8, an illustration of a table of levels of detail is depicted in accordance with an advantageous embodiment. In this illustrative example, table 800 includes column 801 for levels of detail 802. Levels of detail 802 are examples of an implementation of number of levels of detail 514 in FIG. 5. Table 800 also includes columns 803, 805, 807, 809, 811, 813, 815, and 817. Further, table 800 includes rows 806, 808, 810, 812, 814, 816, 818, 820, 822, 824, and 826.

Each row in table 800 defines the amount of information for a particular level of detail in levels of detail 802. As depicted, row 806 defines a "0" level of detail, row 808 defines a "1" level of detail, row 810 defines a "2" level of detail, row 812 defines a "3" level of detail, row 814 defines a "4" level of detail, row 816 defines a "5" level of detail, row 818 defines a "6" level of detail, row 820 defines a "7" level of detail, row 822 defines an "8" level of detail, row 824 defines a "9" level of detail, and row 826 defines a "10" level of detail. These levels of detail may be for a feature of a part or the part itself.

In this illustrative example, columns 803, 805, 807, 809, 811, 813, 815, and 817 of table 800 are for the different types of information that may be included in levels of detail 802. Column 803 indicates whether a feature is included in a particular level of detail. Column 805 is for a part number. Column 807 indicates whether a point definition or a geometric definition is included in the particular level of detail. Column 809 is for an amount of external definition. Column 811 is for an amount of internal definition. Column 813 is for an amount of textual information. Column 815 is for an amount of assembly definition. Column 817 is for an amount of simulation definition.

In these examples, an amount of information in columns 809, 811, 813, 815, and 817 may be selected from one of "no", "limited", and "full". In other advantageous embodiments, different amounts may be present.

In this illustrative example, levels of detail 802 have an increasing amount of information from row 806 to row 826. For example, row 806 defines a "0" level of detail, which includes the least amount of information. With a "0" level of detail for a feature of a part, the feature of the part is not to be included in the model of the part. Further, row 826 defines a "10" level of detail, which includes the greatest amount of information.

With reference now to FIG. 9, an illustration of information provided by a particular level of detail for a bolt head is depicted in accordance with an advantageous embodiment. In this illustrative example, table 900 provides associations, such as associations within plurality of associations 521 in FIG. 5. Table 900 provides information for a "3" level of detail for bolt head 901. As depicted, bolt head 901 is a primary feature of a bolt.

In this illustrative example, table 900 has columns 902, 904, 906, 908, and 910. Column 902 has primary features, column 904 contains secondary features, and column 906 has tertiary features. Additionally, column 908 identifies a level of detail, and column 910 identifies a history.

As depicted in these examples, primary features in column 902, secondary features in column 904, and tertiary features in column 906 are organized in a hierarchal order, such as hierarchal order 602 for plurality of features 600 in FIG. 6.

Each of the rows in table 900 provides an association of a feature, a level of detail, and a history to each other. For example, bolt head 901 is a primary feature with a "3" level of detail and no associated history in this example. Secondary features for bolt head 901 include head type 914, head thickness 916, captive washer 918, and lock wire holes 920. Tertiary features for head type 914 include recessed 922 and chamfered 924. Tertiary features for captive washer 918 include thickness 926 and diameter 928. Tertiary features for lock wire holes 920 include diameter 930 and location 932.

As depicted in this illustrative example, each of the secondary features and tertiary features in table 900 for bolt head 901 are associated with a level of detail. The features in table 900 that have a "0" level of detail in column 908 are not included in a model of the bolt. Further, each of the secondary features and tertiary features in table 900 with a level of detail greater than a "0" level of detail are associated with a history. In this illustrative example, the history provides a condition for including a particular feature with a particular level of detail.

As one illustrative example, thickness 926 has a "3" level of detail for bolt head 901. Business condition 934 provides a reason for using the "3" level of detail for thickness 926. More specifically, business condition 934 indicates that a "3" level of detail for thickness 926 is needed for checking a fit of a bolt and properly positioning the shaft length of the bolt.

As another example, modeling program condition 936 in the history for head type 914 indicates that a "3" level of detail for head type 914 is needed for three-dimensional model-based documentation modeling (3D-MBD).

Figure 10:
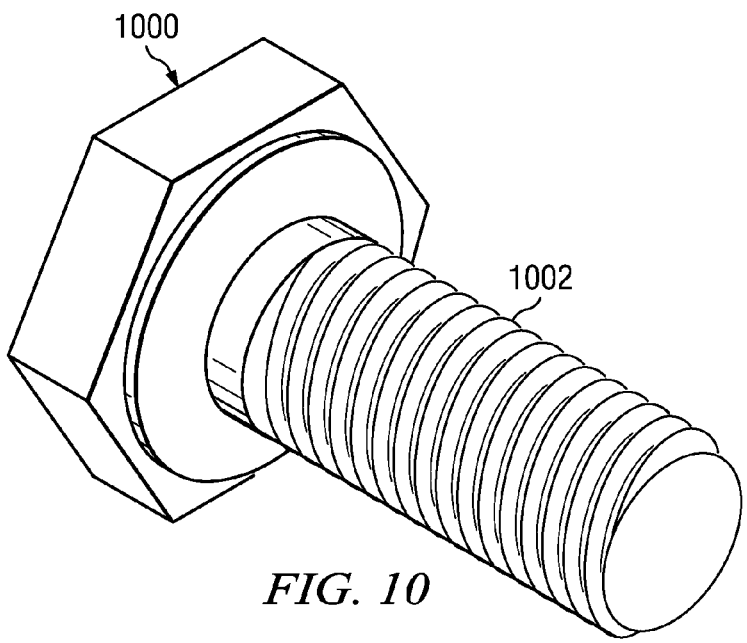
FIG. 10 is an illustration of a model of a part in accordance with an advantageous embodiment.

With reference now to FIG. 10, an illustration of a model of a part is depicted in accordance with an advantageous embodiment. In this illustrative example, model 1000 is an example of one implementation for model 526 in FIG. 5. As depicted, model 1000 is for bolt 1002. Model 1000 is formed with a "3" level of detail in this illustrative example. This "3" level of detail may be the "3" level of detail as defined by row 812 in FIG. 8.

Figure 11:
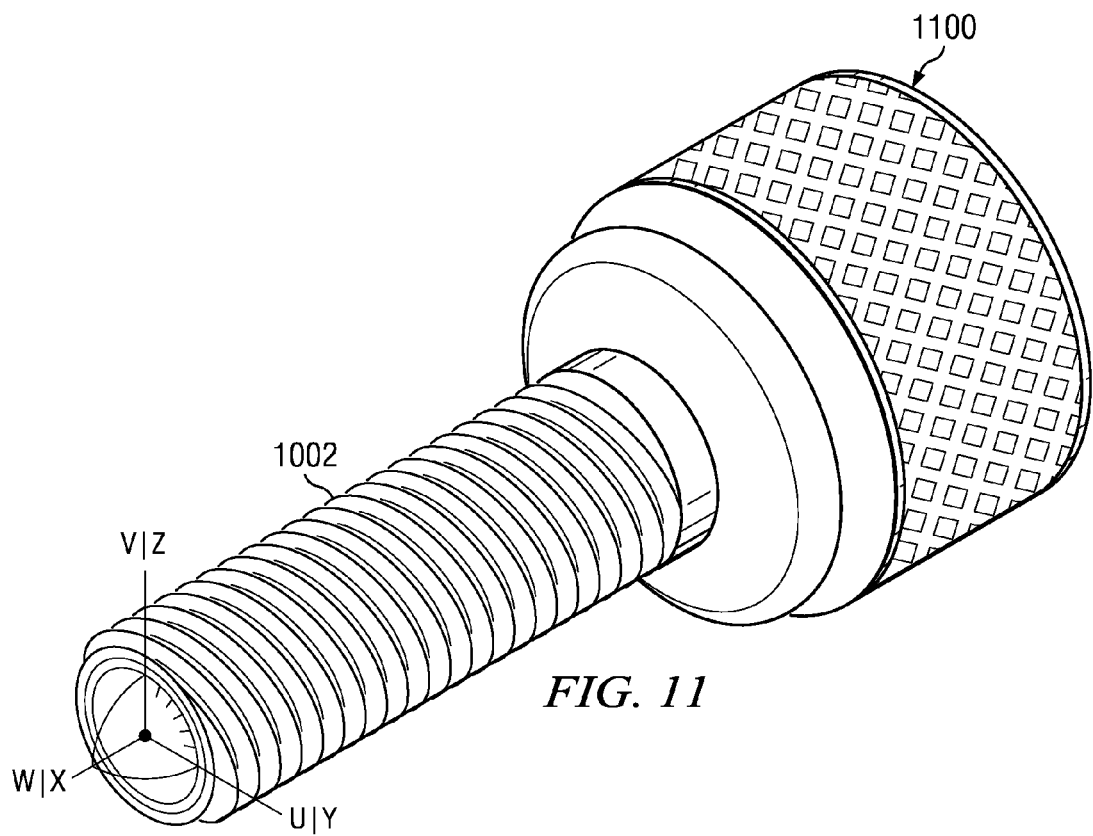
FIG. 11 is an illustration of a model of a part in accordance with an advantageous embodiment.

With reference now to FIG. 11, an illustration of a model of a part is depicted in accordance with an advantageous embodiment. In this illustrative example, model 1100 is an example of one implementation for model 526 in FIG. 5. Further, model 1100 is for bolt 1002 in FIG. 10. As depicted, model 1100 has a greater level of detail than model 1000 for bolt 1002 in FIG. 10.

In this illustrative example, model 1100 has a "9" level of detail. This "9" level of detail may be the "9" level of detail as defined by row 824 in FIG. 8. Further, model 1100 of bolt 1002 includes a greater amount of information for bolt 1002 as compared to model 1000 of bolt 1002 in FIG. 10.

Figure 12:
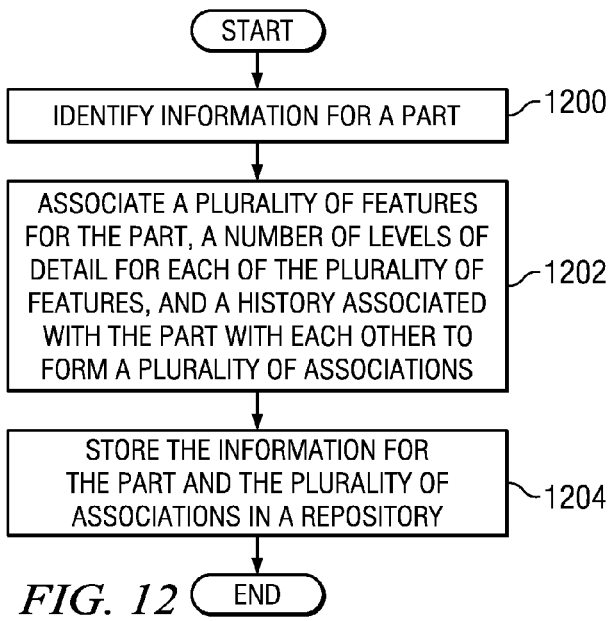
FIG. 12 is an illustration of a flowchart of a process for managing information for parts in accordance with an advantageous embodiment.

With reference now to FIG. 12, an illustration of a flowchart of a process for managing information for parts is depicted in accordance with an advantageous embodiment. The process illustrated in FIG. 12 may be implemented in design environment 500 in FIG. 5. Further, the process may be implemented using a network data processing system, such as network data processing system 300 in FIG. 3.

The process begins by identifying information for a part (operation 1200). This information may be used to generate a model of the part. The model may be generated using, for example, computer-aided design program 536 in FIG. 5. Further, the part may be a part within plurality of parts 506 in FIG. 5. For example, without limitation, the part may be a nut, a bolt, a rivet, a connector, a latch assembly, or some other suitable part.

Thereafter, the process associates a plurality of features for the part, a number of levels of detail for each of the plurality of features, and a history associated with the part with each other to form a plurality of associations (operation 1202). The process then stores the information for the part and the plurality of associations in a repository (operation 1204), with the process terminating thereafter. In operation 1204, the repository may be implemented using repository 502 in FIG. 5. Repository 502 in FIG. 5 may be accessed by a user to generate a model of a part using the information for the part and the plurality of associations.

Figure 13:
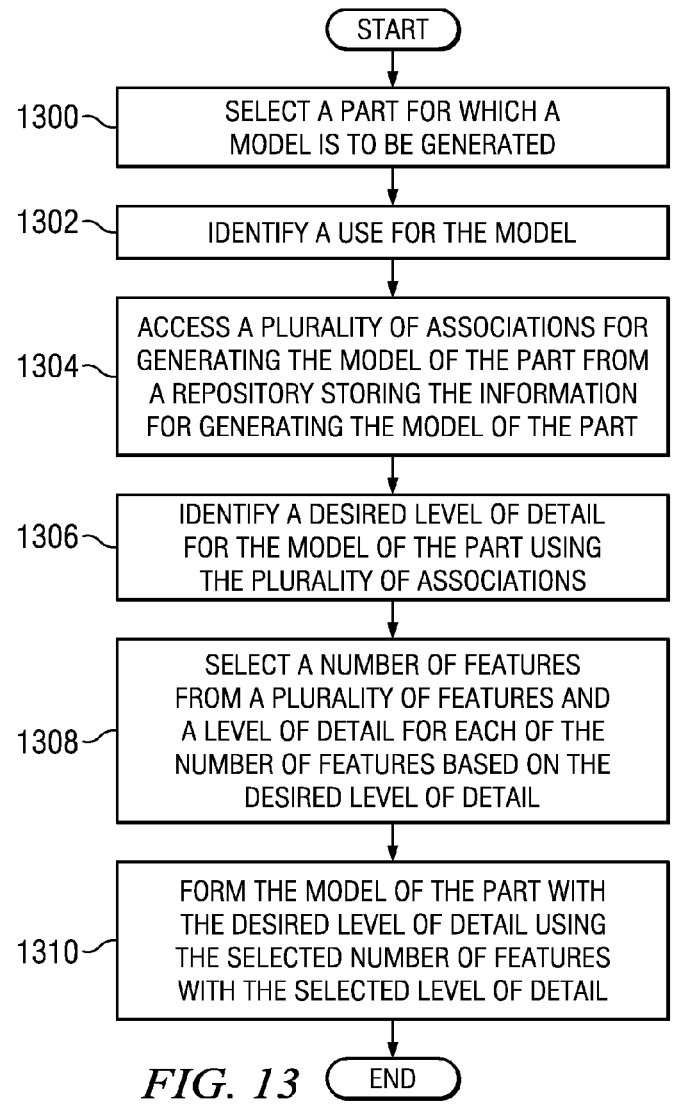
FIG. 13 is an illustration of a flowchart of a process for forming a model in accordance with an advantageous embodiment.

With reference now to FIG. 13, an illustration of a flowchart of a process for forming a model is depicted in accordance with an advantageous embodiment. The process illustrated in FIG. 13 may be implemented in design environment 500 in FIG. 5. In particular, the process may be implemented using computer program 534 running on computer system 504 in FIG. 5.

The process begins by selecting a part for which a model is to be generated (operation 1300). The process identifies a use for the model (operation 1302). This use may comprise a number of business uses, a number of rules, the computer program through which the model will be formed, the file format in which the model may be performed, and/or any other suitable type of use.

The process then accesses a plurality of associations for generating the model of the part from a repository storing the information for generating the model of the part (operation 1304). The plurality of associations may be used to match the use for the model to a plurality of features for the part, a history, and a number of levels of detail for each of the plurality of features to each other. Thereafter, the process identifies a desired level of detail for the model of the part using the plurality of associations (operation 1306).

The process then selects a number of features from a plurality of features and a level of detail for each of the number of features based on the desired level of detail (operation 1308). Thereafter, the process forms the model of the part with the desired level of detail using the selected number of features with the selected level of detail (operation 1310), with the process terminating thereafter.

Figure 14:
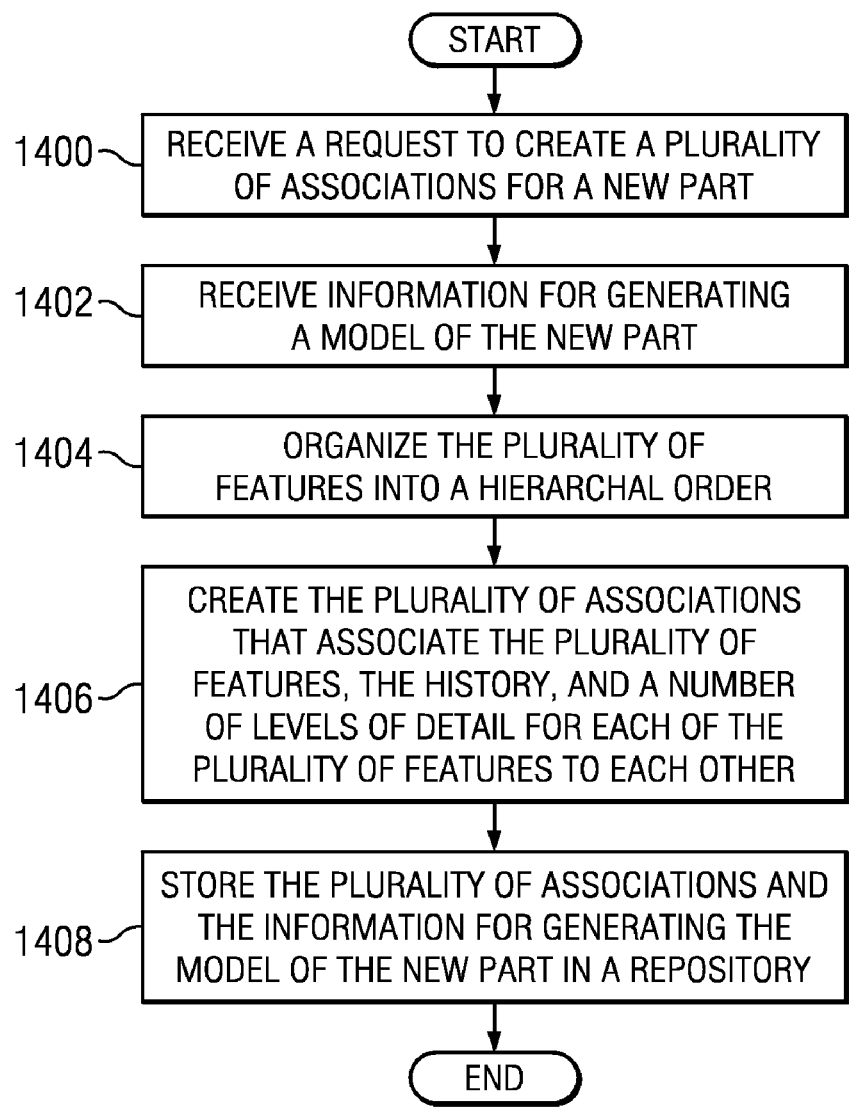
FIG. 14 is an illustration of a flowchart of a process for creating a plurality of associations in accordance with an advantageous embodiment.

With reference now to FIG. 14, an illustration of a flowchart of a process for creating a plurality of associations is depicted in accordance with an advantageous embodiment. The process illustrated in FIG. 14 may be implemented in design environment 500 in FIG. 5. The plurality of associations created in this process may be for a new part not already having information for generating the model of the part stored in repository 502 in FIG. 5.

The process begins by receiving a request to create a plurality of associations for a new part (operation 1400). The process receives information for generating a model of the new part (operation 1402). This information may include a plurality of features, a history associated with the plurality of features, and/or other suitable information. The plurality of features may include, for example, a definition of a physical component of the part, information about a construction of the physical component, information about a use of the physical component, information about a relation of the physical component to another physical component, and/or other suitable features.

Thereafter, the process organizes the plurality of features into a hierarchal order (operation 1404). For example, the plurality of features may be organized into primary features, secondary features, and tertiary features.

Based on this hierarchal order and the history associated with plurality of features, the process creates the plurality of associations that associate the plurality of features, the history, and a number of levels of detail for each of the plurality of features to each other (operation 1406).

Thereafter, the process stores the plurality of associations and the information for generating the model of the new part in a repository (operation 1408), with the process terminating thereafter.

Figure 15:
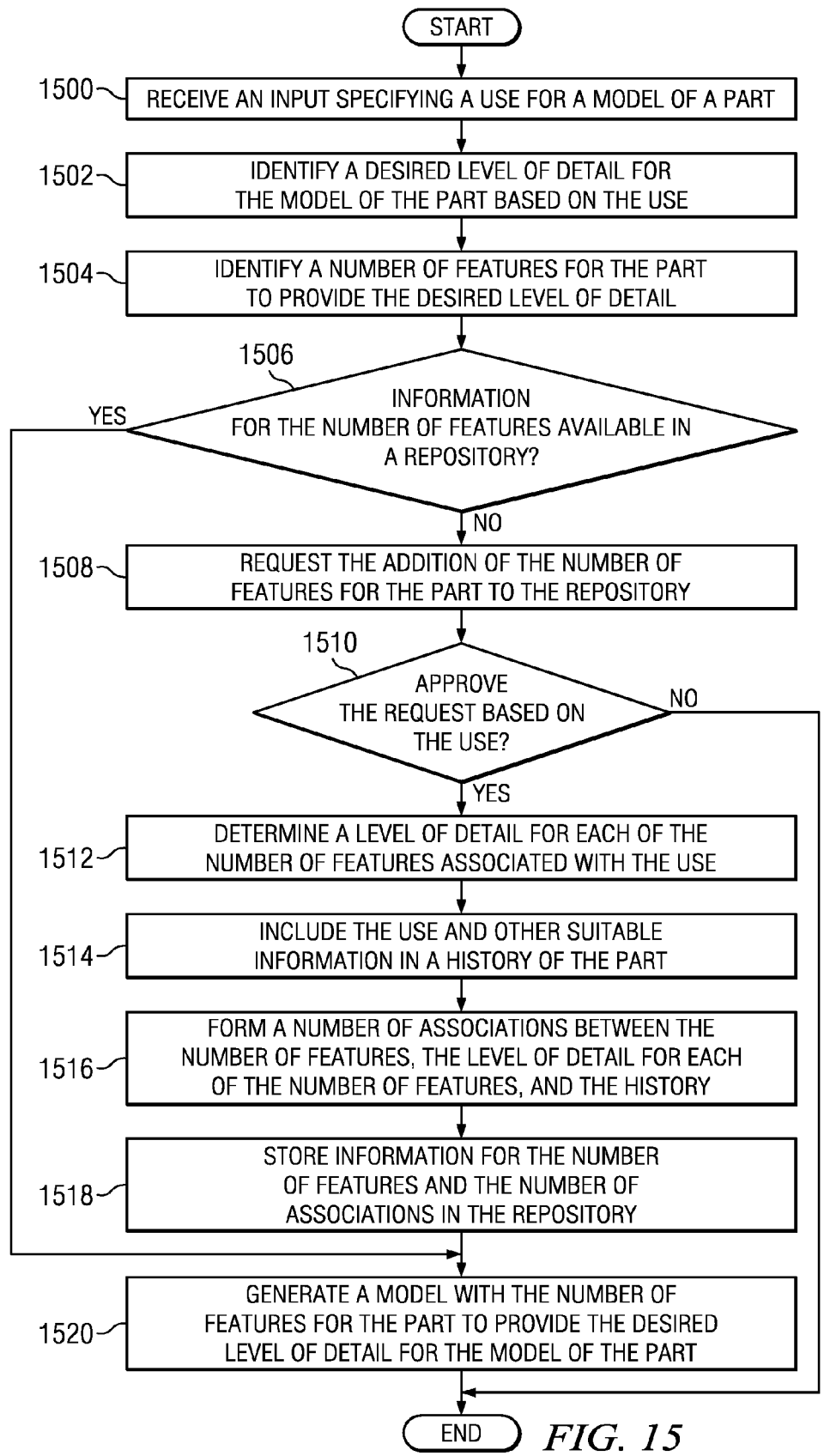
FIG. 15 is an illustration of a flowchart of a process for managing information in accordance with an advantageous embodiment.

With reference now to FIG. 15, an illustration of a flowchart of a process for managing information is depicted in accordance with an advantageous embodiment. The process illustrated in FIG. 15 may be implemented using network 302 in network data processing system 300 in FIG. 3. In particular, this process may be implemented using repository 502 and computer system 504 in design environment 500 in FIG. 5.

The process begins by receiving an input specifying a use for a model of a part (operation 1500). The input may be received at a computer system, such as computer system 504 in FIG. 5. The use may be comprised of, for example, without limitation, a number of business uses, a number of safety requirements, a number of client requests, a number of rules, a computer program for generating the model, a file format for the model, and/or some other suitable use.

Thereafter, the process identifies a desired level of detail for the model of the part based on the use (operation 1502). The desired level of detail specifies an amount of information to include in the model of the part. The process then identifies a number of features for the part to provide the desired level of detail (operation 1504). The number of features for the part may be, for example, a name of the part or feature of the part, a definition of a physical component of the part, information about a construction of the physical component, information about a use of the physical component, information about a relation of the physical component to another physical component, and/or some other suitable feature.

The process determines whether information for the number of features is available in a repository (operation 1506). The repository, in these examples, may be repository 502 in FIG. 5. If information for the number of features is not available in the repository, the process requests the addition of the number of features for the part to the repository (operation 1508). Thereafter, the process determines whether to approve the request based on the use specified in operation 1500 (operation 1510). If the request is approved, the process determines a level of detail for each of the number of features associated with the use (operation 1512). This level of detail indicates the amount of information and the types of information to be provided in the model based on the use.

The process then includes the use and other suitable information in a history of the part (operation 1514). In this illustrative example, the history of the part is stored in the repository. This history may be accessed by the computer system. Thereafter, the process forms a number of associations between the number of features, the level of detail for each of the number of features, and the history (operation 1516). In this illustrative example, the number of associations may be formed based on input received from a user. In other advantageous embodiments, the number of features, the level of detail for each of the number of features, and the history may be organized in a data structure such that the number of associations is formed. The data structure may be, for example, without limitation, a number of tables, a database, an extensible markup language (XML) data structure, a data file, or some other suitable type of data structure.

The process then stores information for the number of features and the number of associations in the repository (operation 1518). In operation 1518, the information for the number of features may be associated with information for the plurality of features of the part also stored in the repository. Thereafter, the process generates a model with the number of features for the part to provide the desired level of detail for the model of the part (operation 1520), with the process terminating thereafter.

With reference again to operation 1510, if the request is not approved, the process terminates. With reference again to operation 1506, if information for the number of features is available in the repository, the process continues to operation 1520, as described above. The process implemented in FIG.

15 may be implemented in a similar fashion for adding information for a new part to a repository to generate a model of the new part.

The flowcharts and block diagrams in the different depicted embodiments illustrate the architecture, functionality, and operation of some possible implementations of apparatus and methods in different advantageous embodiments. In this regard, each block in the flowcharts or block diagrams may represent a module, segment, function, and/or a portion of an operation or step. In some alternative implementations, the function or functions noted in the blocks may occur out of the order noted in the figures. For example, in some cases, two blocks shown in succession may be executed substantially concurrently, or the blocks may sometimes be executed in the reverse order, depending upon the functionality involved.

The different advantageous embodiments can take the form of an entirely hardware embodiment, an entirely software embodiment, or an embodiment containing both hardware and software elements. Some embodiments are implemented in software, which includes, but is not limited to, forms such as, for example, firmware, resident software, and microcode.

Furthermore, the different embodiments can take the form of a computer program product accessible from a computer-usable or computer-readable medium providing program code for use by or in connection with a computer or any device or system that executes instructions. For the purposes of this disclosure, a computer-usable or computer-readable medium can generally be any tangible apparatus that can contain, store, communicate, propagate, or transport the program for use by or in connection with the instruction execution system, apparatus, or device.

The computer-usable or computer-readable medium can be, for example, without limitation, an electronic, magnetic, optical, electromagnetic, infrared, or semiconductor system, or a propagation medium. Non-limiting examples of a computer-readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W), and DVD.

Further, a computer-usable or computer-readable medium may contain or store a computer-readable or usable program code such that when the computer-readable or usable program code is executed on a computer, the execution of this computer-readable or usable program code causes the computer to transmit another computer-readable or usable program code over a communications link. This communications link may use a medium that is, for example, without limitation, physical or wireless.

A data processing system suitable for storing and/or executing computer-readable or computer-usable program code will include one or more processors coupled directly or indirectly to memory elements through a communications fabric, such as a system bus. The memory elements may include local memory employed during actual execution of the program code, bulk storage, and cache memories which provide temporary storage of at least some computer-readable or computer-usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems or remote printers or storage devices through intervening private or public networks. Non-limiting examples are modems and network adapters and are just a few of the currently available types of communications adapters.

The description of the different advantageous embodiments has been presented for purposes of illustration and description, and it is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
information for a plurality of parts in which the information is stored in a repository and comprises a plurality of features for each of the plurality of parts, a number of levels of detail, and a history associated with the plurality of features for the each of the plurality of parts, wherein each feature in the plurality of features is associated with the number of levels of detail, each further level of detail defining an greater amount of information; and
a computer system configured to identify a desired level of detail for a model of a part; select a number of features from the plurality of features corresponding to the desired level of detail for the model of the part in which each of the number of features selected has a level of detail in the number of levels of detail corresponding to the desired level of detail for the model of the part; and generate the model of the part with the desired level of detail using the information for the part, the desired level of detail for the model of the part, and the number of features selected from the plurality of features.

2. The apparatus of claim 1, wherein the desired level of detail is identified based on a use for the model of the part.

3. The apparatus of claim 2, wherein the use for the model of the part comprises at least one of a number of business uses, a number of safety requirements, a number of client requests, a number of rules, a computer program, a file format, a presentation of the part to a customer, manufacturing of the part, design of the part, a simulation using the part, and testing the part.

4. The apparatus of claim 2, wherein the computer system is configured to identify the use for the model of the part based on an input received at the computer system.

5. The apparatus of claim 2, wherein the computer system uses a plurality of associations to identify the desired level of detail for the model of the part, and wherein the plurality of associations associates the plurality of features, the number of levels of detail, and the history to each other.

6. The apparatus of claim 5, wherein the number of features selected from the plurality of features and the level of detail for the each of the number of features are based on the plurality of associations.

7. The apparatus of claim 5, wherein the computer system uses the plurality of associations to identify the desired level of detail for the model of the part by matching the use for the model of the part to the plurality of features, the number of levels of detail, and the history.

8. The apparatus of claim 5, wherein a feature within the plurality of features is associated with at least one level of detail in the number of levels of detail.

9. The apparatus of claim 1, wherein the plurality of features is organized in a hierarchical order.

10. The apparatus of claim 1, wherein a feature in the plurality of features is one of a name of the feature or the part, a definition of a physical component of the part, information about a construction of the physical component, information about a use of the physical component, and information about a relation of the physical component to another physical component.

11. The apparatus of claim 1, wherein the model of the part is formed using a first computer-aided design program, wherein the information is derived from both the first computer-aided design program and a second computer-aided design program having features that are different than the first computer-aided design program, wherein the first computer-aided design program and the second computer-aided design program use different file formats, and wherein the first computer-aided design program and the second computer-aided design program have different amounts of part information for the part.

12. A design environment comprising:
   a repository;
   information for a plurality of parts stored in the repository, wherein the information comprises a plurality of features for each of the plurality of parts, a number of levels of detail, and a history associated with the plurality of features for the each of the plurality of parts, and each feature in the plurality of features is associated with the number of levels of detail, each further level of detail defining a greater amount of information;
   a computer program stored on a storage device; and
   a computer system connected to the repository and configured to run the computer program to identify a desired level of detail for a model of a part; select a number of features from the plurality of features corresponding to the desired level of detail for the model of the part in which each of the number of features selected has a level of detail in the number of levels of detail corresponding to the desired level of detail for the model of the part; and generate the model of the part with the desired level of detail using the information for the part, the desired level of detail for the model of the part, and the number of features selected from the plurality of features.

13. The design environment of claim 12, wherein the desired level of detail is identified based on a use for the model of the part.

14. The design environment of claim 13, wherein the computer system is configured to run the computer program to identify the use for the model of the part based on an input received at the computer system.

15. The design environment of claim 13, wherein the computer system uses a plurality of associations to identify the desired level of detail for the model of the part and wherein the plurality of associations associates the plurality of features, the number of levels of detail, and the history to each other.

16. The design environment of claim 15, wherein the number of features selected from the plurality of features and the level of detail for the each of the number of features are based on the plurality of associations.

17. The design environment of claim 15, wherein the computer system uses the plurality of associations to identify the desired level of detail for the model of the part by matching the use for the model of the part to the plurality of features, the number of levels of detail, and the history.

18. The design environment of claim 13, wherein the use for the model of the part comprises at least one of a number of business uses, a number of safety requirements, a number of client requests, a number of rules, a computer program, a file format, a presentation of the part to a customer, manufacturing of the part, design of the part, a simulation using the part, and testing the part.

19. The design environment of claim 12 further comprising:
   a network, wherein the computer system is connected to the repository by the network.

20. A method for managing information for parts, the method comprising:
   identifying, using a processor unit, the information for a part, wherein the information comprises a plurality of features for the part, a number of levels of details for each of the plurality of features, and a history associated with the plurality of features for the part, each further level of detail defining a greater amount of information;
   associating, using the processor unit, the plurality of features for the part, the number of levels of detail for the each of the plurality of features, and the history associated with the plurality of features with each other to form a plurality of associations; and
   storing, using the processor unit, the information and the plurality of associations in a repository.

21. The method of claim 20 further comprising:
   identifying, using the processor unit, a desired level of detail to form a model of the part, wherein the model has the desired level of detail;
   selecting, using the processor unit, a number of features from the plurality of features based on the desired level of detail; and
   selecting, using the processor unit, a level of detail in the number of levels of detail for each of the number of features selected based on the desired level of detail to form the model of the part with the desired level of detail.

22. The method of claim 21, wherein the step of identifying the desired level of detail to form the model of the part comprises:
   using the plurality of associations to match a use for the model of the part to the plurality of features, the number of levels of detail for the each of the plurality of features, and the history associated with the plurality of features.

23. The method of claim 21, wherein the step of selecting the number of features from the plurality of features comprises:
   using the plurality of associations to select the number of features from the plurality of features.

24. The method of claim 21, wherein the step of selecting the level of detail in the number of levels of detail for the each of the number of features selected comprises:
   using the plurality of associations to select the level of detail for the each of the number of features.

25. The method of claim 21 further comprising:
   generating, using the processor unit, the model of the part with the desired level of detail using the information for the part, the desired level of detail for the model of the part, and the number of features selected from the plurality of features.

* * * * *